(12) United States Patent
Hilton et al.

(10) Patent No.: US 6,576,073 B2
(45) Date of Patent: Jun. 10, 2003

(54) ADHESIVE CONTROL DURING STIFFENER ATTACHMENT TO PROVIDE CO-PLANARITY IN FLIP CHIP PACKAGES

(75) Inventors: Robert M Hilton, Burpengary (AU); Sabran Bin Samsuri, Penang (MY)

(73) Assignees: Celerity Research Pte. Ltd. (SG); ASE Electronics (M) Sdn. Bhd., Penang (MY)

( * ) Notice: Subject to any disclaimer, the term of this patent is extended or adjusted under 35 U.S.C. 154(b) by 44 days.

(21) Appl. No.: 09/683,304

(22) Filed: Dec. 11, 2001

(65) Prior Publication Data

US 2002/0040751 A1 Apr. 11, 2002

(51) Int. Cl.7 .............................................. B32B 31/00
(52) U.S. Cl. ........................ 156/64; 156/297; 156/298; 156/299; 156/300

(58) Field of Search ........................ 156/64, 297, 298, 156/299, 300, 358, 360, 356; 438/14, 15, 16, 108

(56) References Cited

U.S. PATENT DOCUMENTS

| | | | |
|---|---|---|---|
| 5,804,004 A | * 9/1998 | Tuckerman et al. | ......... 156/300 |
| 5,985,064 A | * 11/1999 | Sato | ............................ 156/64 |
| 6,015,722 A | * 1/2000 | Banks et al. | ................ 438/108 |

* cited by examiner

Primary Examiner—Richard Crispino
Assistant Examiner—George R. Koch, III
(74) Attorney, Agent, or Firm—David T. Millers

(57) ABSTRACT

A process for fabricating a BGA flip chip package containing a stiffener or heat spreader monitors edges of the adhesive that attaches the stiffener or heat spreader. The monitoring ensures that the adhesive extends beyond the centers of the outermost solder balls in the BGA. Stress at the edge of the adhesive thus does not cause warping or variations within the BGA.

5 Claims, 1 Drawing Sheet

ADHESIVE CONTROL DURING STIFFENER ATTACHMENT TO PROVIDE CO-PLANARITY IN FLIP CHIP PACKAGES

BACKGROUND OF THE INVENTION

Warping is a significant problem for flip chip ball grid array (BGA) packages. Generally, warping reduces the planarity of the package and makes external and internal connections of the package more difficult and less dependable. In particular, the stress that causes the warping typically varies with the temperature so that thermal cycling of a package can make connections unreliable in the area of the warping.

A common operation in the manufacture of a flip chip BGA package is the attachment of a stiffener or heat spreader around the perimeter of the substrate in the package. The same structure typically acts as both a stiffener and a heat spreader to improve the mechanical and thermal performance of the package. To simplify terminology, the term stiffener is used herein to designate such a structure whether the primary purpose of the structure is to improve mechanical or thermal performance of a package.

A typical process for attaching a stiffener applies a thermally activated adhesive to the substrate and/or the stiffener, places the stiffener and substrate in contact with the adhesive sandwiched between the stiffener and substrate, and applies pressure and heat. Control or monitoring of the process ensures that the resulting product is flat and uniform in appearance and/or ensures that the separation between the substrate and stiffener is uniform.

Adhesive generally must be kept from escaping or protruding from the edge of the package to avoid changing the package outline from the required design standard. A key control of the attachment process keeps the adhesive well back from the edge of the package to prevent the escape of adhesive. However, edge effects of the adhesive can cause stress that warps the substrate and can affect the outer solder balls in the BGA. Accordingly, methods for manufacturing a flip chip BGA package and attaching a stiffener without creating stress and warping that affects the BGA are desired.

SUMMARY OF THE INVENTION

In accordance with an aspect of the invention, an attachment process controls the minimum extent of the adhesive that attaches a stiffener to a substrate in a BGA flip-chip package. In particular, the edge of the adhesive is controlled to be beyond the centers of the outermost balls in the ball grid array. Accordingly, edge effects that may warp the substrate at the edge of the adhesive do not affect the ball grid array.

One specific embodiment of the invention is a process for fabricating an integrated circuit package. The process includes: creating a composite structure including the substrate, an adhesive layer, and a stiffener; and controlling an edge of the adhesive layer to ensure that a distance from an edge of the integrated circuit package to the edge of the adhesive is less than a distance from the edge of the integrated circuit package to a center of an outermost solder ball on the substrate. The stiffener can change the tensile characteristics of the package and/or act as a heat spreader to improve the thermal characteristics of the package. Conventional techniques for controlling the amount and placement of the adhesive between the stiffener and the substrate and the pressure applied to the composite structure to force the adhesive toward the edge of the package can place the edge of the adhesive outside the outermost solder balls in the ball grid array.

DETAILED DESCRIPTION

A manufacturing process for a ball grid array (BGA) flip-chip package controls the minimum extent of adhesive that attaches a stiffener to a substrate in the package. Prior packaging processes, which have not controlled minimum extent of the adhesive, have allowed the fillet of adhesive to creep inside a boundary corresponding to the centers of outer solder balls in the BGA. If the fillet of adhesive is within that boundary, stress at the edge of the adhesive can warp a portion of the substrate on which the outer solder balls reside. The warping primarily results from the turning moment of the substrate at the edge of the adhesive and the shrinkage of the adhesive during curing. Accordingly, the stiffener does not ensure uniform performance inside the final BGA.

The action of laminating the stiffener to the substrate creates a modified tensile characteristic or elasticity of the substrate in the substrate-adhesive-stiffener sandwich. For optimum performance, variations in the elasticity or stiffness inside any BGA pitch must be avoided. An underfill material maintains uniform performance for the portion of the substrate near the chip and an inner boundary of the stiffener, but at the outer edge, variations in the extent of the adhesive can cause variation in performance. In accordance with an aspect of the invention, a fabrication process controls the adhesive so that the variations are outside the ball grid array.

Figure 1:
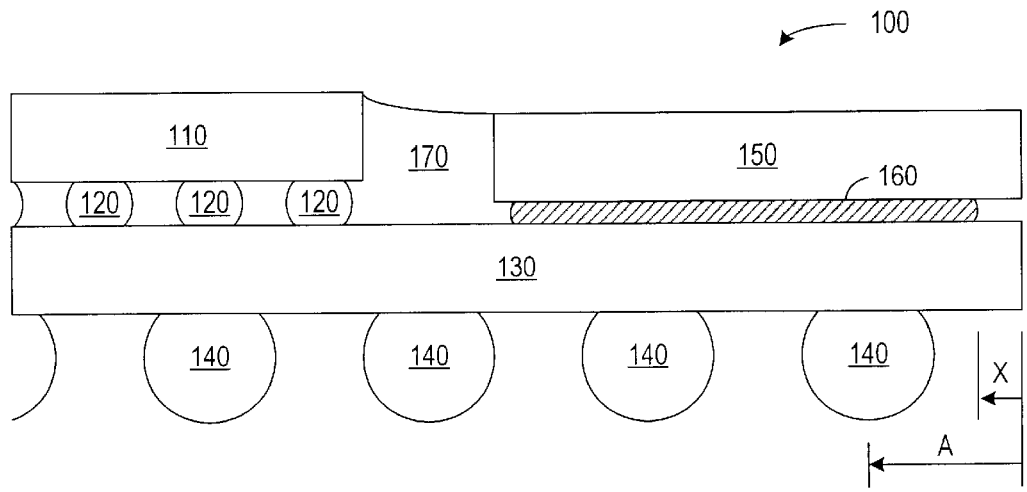
FIG. 1 is a cross-sectional view of a portion of a BGA flip-chip package in accordance with an embodiment of the invention.

FIG. 1 shows a cross-sectional view of a BGA flip-chip package 100 having an adhesive fillet 160 controlled in accordance with an embodiment of the invention. Package 100 includes an integrated circuit chip 110 having an array of contacts or solder balls 120 attached to a substrate 130. Chip 110 can generally be any type of semiconductor device but generally is an integrated circuit having a large array of contacts to take advantage of the large number of electrical connections that BGA packages provide.

Substrate 130 is typically made of circuit board material such as polyimide, polyimide alloy, non alloy general polymer such as a BT epoxy and metal composites or ceramic, or metal composites and glass or similar material, and substrate 130 typically has a thickness of 0.5 mm or greater in current flip-chip BGA packages. Metal traces on and through substrate 130 electrically connect solder balls 120 to solder balls 140.

Solder balls 140 form a BGA on the under side of substrate 130. The BGA serves to electrically connect chip 110 to an external circuit (not shown) in conventional manner well known in the art. In the cross-section illustrated in FIG. 1, the center of an outermost ball 140 is a distance A, typically about 1.0 mm, from the edge of package 100.

Adhesive fillet 160 is on a top surface of substrate 130 and attaches substrate 140 to stiffener 150. Stiffener 150 is a one-piece structure with a central opening in which chip 110 resides when stiffener 150 is attached to substrate 130. Stiffener 150 serves to improve the mechanical or thermal performance of package 100. In a typical BGA flip-chip package, stiffener 150 is made of a material such as filled organic resin or epoxy, a polymer which is filled with property modifying materials such as quartz, ceramic, metal spheres or fibers or pieces, modified silicones, a variety of metals or metal alloys and is typically about 0.5 mm thick or greater.

Adhesive fillet 160 can be made of a material such as filled organic resin or epoxy, polyimide, polymer with property modifying materials added, a dispensed organic isolative material, modified silicone, thermo setting organic mold compound, or thermo plastic organic mold compound and has a typical thickness of less than 2.0 mil. The outer edge of adhesive fillet 160 is a distance X, typically less than 0.5 mm, from the outer edge of package 100. In accordance with an aspect of the invention, manufacture of package 100 is controlled so that distance X is greater than or equal to zero and less than distance A. Accordingly, the edge of adhesive 160 is outside the perimeter of the BGA, and any stress at the edge of adhesive 160 does not affect the BGA. Additionally, the tensile and elasticity characteristics of the BGA and package 100 are uniform across the entire area of the BGA including the outermost solder balls 140 in the BGA.

Figure 2:
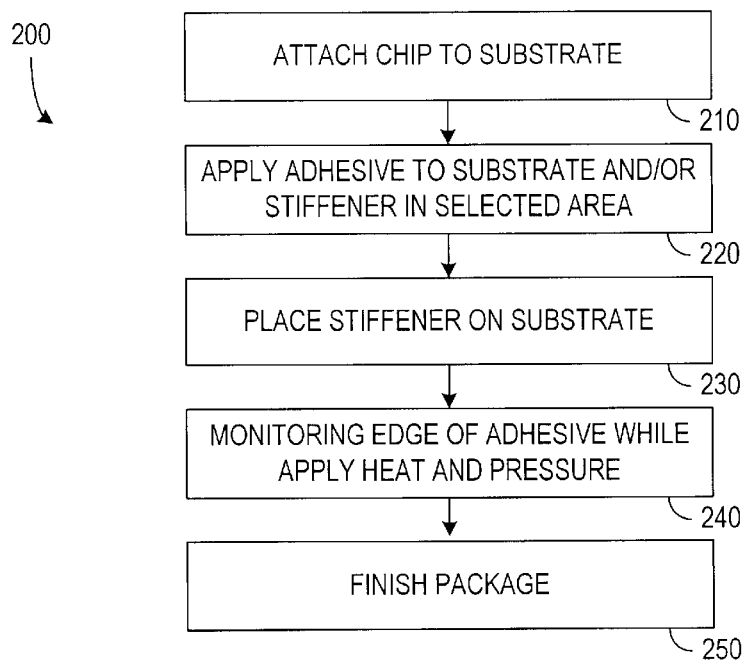
FIG. 2 is a flow diagram of a process for attaching a stiffener for a BGA flip-chip package in accordance with an embodiment of the invention.

FIG. 2 is a flow diagram of a process 200 for forming flip-chip package 100. Process 200 begins with a step 210 of attaching chip 110 to substrate 130 using conventional techniques that are well known in the art and not critical to the invention. An adhesive such as one of those previously described is applied to substrate 130 and/or stiffener 150 in step 220. The amount and placement of the uncured adhesive when applied is controlled according to the target position for the outer edge of adhesive 160.

Once the uncured adhesive is applied, stiffener 150 is placed on substrate 130 in step 230, and step 240 applies heat and pressure to stiffener 150 and substrate 230 to cure adhesive 160. The heat and pressure force adhesive 160 to its furthest extent, and step 240 may include monitoring the location of the edge of adhesive 160 to ensure distance X from the edge of adhesive 160 to the edge of package 100 is in the desired range (0<X<A). More particularly, if monitoring indicates the edge is further than distance A the pressure can be increased to force adhesive 160 closer to the edge of package 100. Monitoring 240 preferably checks the location of the edge of adhesive 160 around the entire perimeter of package 100.

After adhesive 160 has the desired edge position and has cured, packaging process step 250 finishes flip-chip package 100. Package process step 250 can include conventional processing techniques known in the art. However, in accordance with an aspect of the invention, an underfill 170 can be added to fill a volume under chip 110 and between chip 110 and stiffener Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A process for fabricating an integrated circuit package, comprising:

attaching a chip to a substrate;

creating a sandwich structure including the substrate, an adhesive layer, and a stiffener;

controlling an edge of the adhesive layer to ensure that a first distance from an edge of the integrated circuit package to the edge of the adhesive is less than a second distance from the edge of the integrated circuit package to a center of an outermost solder ball on the substrate; and wherein controlling the edge of the adhesive layer comprises monitoring a location of the edge of the adhesive layer.

2. The process of claim 1, wherein the stiffener changes tensile characteristics of the package.

3. The process of claim 1, wherein the stiffener is a heat spreader.

4. The process of claim 1, further comprising:

applying pressure to the sandwich structure; and adjusting the pressure to extend the adhesive layer so that the first distance is less than the second distance.

5. The process of claim 1, wherein the first distance from an edge of the integrated circuit package to the edge of the adhesive layer is greater than zero.

* * * * *